United States Patent
Duan et al.

(10) Patent No.: US 11,965,944 B2
(45) Date of Patent: Apr. 23, 2024

(54) COMPACT, MULTI-USER, MULTI-LEVEL, MULTI-TARGET MAGNETIC TRACKING SYSTEM

(71) Applicant: Apple Inc., Cupertino, CA (US)

(72) Inventors: Guangwu Duan, Cupertino, CA (US); Jian Guo, Milpitas, CA (US); John Greer Elias, Townsend, DE (US); Savas Gider, San Jose, CA (US)

(73) Assignee: Apple Inc., Cupertino, CA (US)

( * ) Notice: Subject to any disclaimer, the term of this patent is extended or adjusted under 35 U.S.C. 154(b) by 318 days.

(21) Appl. No.: 17/410,980

(22) Filed: Aug. 24, 2021

(65) Prior Publication Data
US 2022/0065958 A1   Mar. 3, 2022

Related U.S. Application Data (60) Provisional application No. 63/071,336, filed on Aug. 27, 2020.

(51) Int. Cl.
*G01R 33/36* (2006.01)
*G01R 33/34* (2006.01)
*G01R 33/385* (2006.01)

(52) U.S. Cl.
CPC .......... *G01R 33/36* (2013.01); *G01R 33/34* (2013.01); *G01R 33/385* (2013.01)

(58) Field of Classification Search
CPC ....... G01R 33/36; G01R 33/34; G01R 33/385
See application file for complete search history.

(56) References Cited

U.S. PATENT DOCUMENTS

| 8,450,997 | B2 | 5/2013 | Silverman |
| 10,534,454 | B2 | 1/2020 | Stafford et al. |
| 2003/0137433 | A1* | 7/2003 | Schiller ............. G01C 19/5719 340/973 |
| 2011/0141853 | A1* | 6/2011 | Megdal .................... G01S 5/30 367/117 |

(Continued)

FOREIGN PATENT DOCUMENTS

| CN | 1563888 | 1/2005 |
| CN | 1576883 | 2/2005 |

(Continued)

OTHER PUBLICATIONS

Yoon et al., "TMotion: Embedded 3D Mobile Input using Magnetic Sensing Technique," TEI'16: Tenth International Conference on Tangible, Embedded, and Embodied Interaction, Feb. 2016, pp. 21-29.

*Primary Examiner* — Junpeng Chen
(74) *Attorney, Agent, or Firm* — Fish & Richardson P.C.

(57) ABSTRACT

Disclosed is a compact, multi-user magnetic tracking system. In an embodiment, a compactness is achieved by using a single coil and inertial sensors at the transmitter and magnetometers and inertial sensors at the receiver for sensing the magnetic field generated by the single coil and for determining a position and attitude of the receiver relative to the transmitter. The transmitter and receiver each include a wireless transceiver for exchanging clock synchronization data and sending transmitter attitude data to the receiver. In another embodiment, frequency or time division multiplexing is used to differentiate between multiple users of the multi-user magnetic tracking system.

12 Claims, 7 Drawing Sheets

(56) References Cited

U.S. PATENT DOCUMENTS

2014/0030955 A1\* 1/2014 Smetanin ................. A63H 3/36
  446/268
2018/0340804 A1   11/2018 Cherkashin
2019/0094406 A1\* 3/2019 Polzer .................. G01R 33/022

FOREIGN PATENT DOCUMENTS

| CN | 102822630 | 12/2012 |
|----|-----------|---------|
| CN | 109655789 | 4/2019  |
| CN | 110133582 | 8/2019  |

\* cited by examiner

COMPACT, MULTI-USER, MULTI-LEVEL, MULTI-TARGET MAGNETIC TRACKING SYSTEM

CROSS REFERENCE TO RELATED APPLICATION

This application claims priority to U.S. Provisional Patent Application No. 63/071,336, filed Aug. 27, 2020, the entire contents of which are incorporated herein by reference.

TECHNICAL FIELD

This disclosure relates to magnetic tracking systems.

BACKGROUND

Magnetic tracking systems are used to track the position of a moving target. Existing magnetic tracking systems include a base station or "transmitter" that generates alternating or static electromagnetic fields (hereinafter "magnetic fields") that cover a three-dimensional (3D) space. The magnetic fields are typically emitted by three coils that are arranged perpendicular to each other, referred to as a "3-axis coil." Alternatively, the 3-axis coil is placed in a housing mounted on a moving platform. A "target" in the proximity of the transmitter senses the change in the magnetic fields as the target moves and its position is determined based on the change. The conventional 3-axis coil transmitter design used in existing magnetic tracking systems has a physical geometry that makes the design unsuitable for certain applications that require housings with thin or flat form factors.

SUMMARY

Disclosed is a compact, multi-user, multi-level, multi-target magnetic tracking system. In a first embodiment, compactness is achieved by a transmitter that includes a single-axis coil, a direct current (DC) magnetometer and inertial sensors, and one or more targets that include an alternating current (AC) magnetometer, a DC magnetometer and inertial sensors. The single-axis coil included in the transmitter side emits a magnetic field which is sensed by an AC magnetometer in each of the one or more targets. The DC magnetometers and the inertial sensors included in the transmitter and one or more targets are used to determine the attitudes of the transmitter and one or more targets, respectively. The transmitter and one or more targets each include a wireless transceiver for transmitting and receiving clock synchronization data and communicating attitude data between the transmitter and target for computing a relative attitude between the transmitter and target or vice-versa.

In a multi-target embodiment, there are a number of targets connected to a particular transmitter and each target is tracked with respect to the transmitter.

In a multi-user embodiment, frequency or time division multiplexing is used to detect and/or differentiate between multiple users of the magnetic tracking system by assigning different frequencies to different transmitters or by ensuring that only one transmitter emits a magnetic field at a time. Each transmitter supports multiple targets.

In a multi-level embodiment, a high-level transmitter tracks the position of lower-level transmitters in the magnetic tracking system. In this embodiment, the AC magnetometer of a lower-level transmitter detects the magnetic field produced by a high-level transmitter, and computes its position with respect to the high-level transmitter.

Particular implementations of a compact, multi-user, multi-level, multi-target magnetic tracking system disclosed herein provide one or more of the following advantages: 1) a reduced form factor due to the AC and DC magnetometers included in the target being reduced to millimeter scale; 2) reduced complexity since there is only one coil included in the transmitter, thus eliminating the need for coil alignment and balancing; 4) less calibration due to the single-axis coil design; 5) improved environment disturbance rejection by operating in the kilohertz (kHz) range; 6) improved robustness using clock synchronization via short range wireless communication (e.g., Bluetooth) and/or phase lock loop (PLL); and 7) the ability to detect and/or differentiate between multiple users using frequency or time division multiplexing.

Other embodiments are directed to systems, method, apparatuses and non-transitory, computer-readable mediums.

The details of the disclosed implementations are set forth in the accompanying drawings and the description below. Other features, objects and advantages are apparent from the description, drawings and claims.

DESCRIPTION OF DRAWINGS

The same reference symbol used in various drawings indicates like elements.

DETAILED DESCRIPTION

Figure 1A:
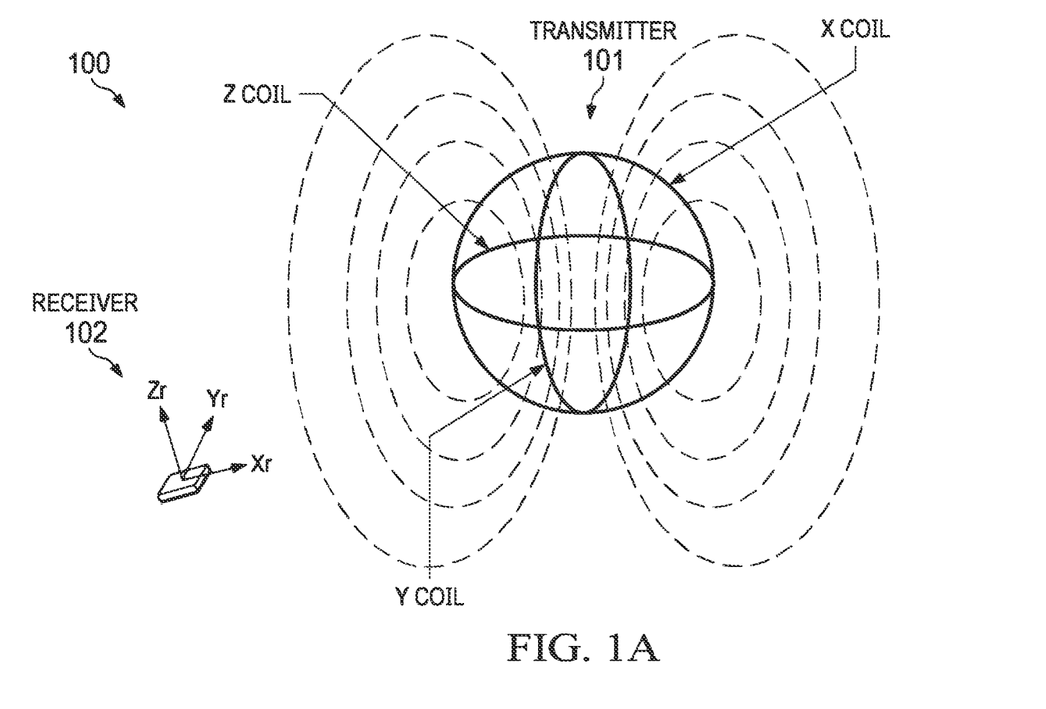
FIG. 1A illustrates a conventional magnetic tracking system with a 3-axis coil transmitter and a 3-axis magnetometer receiver.

FIG. 1A illustrates magnetic tracking system 100 that includes a transmitter 101 (Tx) which can be any device that has a conventional 3-axis coil, and receiver 102 (Rx) for sensing magnetic fields generated by transmitter 101. In this embodiment and subsequent embodiments described herein, transmitter 101 is stationary and receiver 102 (hereinafter also referred to as "target") is tracked by transmitter 101. Receiver 102 can include any device that has a 3-axis magnetometer (e.g., coils, Hall sensors, magnetoresistive (MR) sensors). The position (x, y, z) of receiver 102 is calculated from the sensed magnetic fields using techniques known in the art. The implementation of the 3-axis coil in transmitter 101 requires significant engineering effort to ensure coil alignment, coil balance and calibration. More importantly, the 3-axis coil transmitter design may not be an option in applications that require a housing with a thin or flat form factor due to the additional height needed to accommodate the z-axis coil.

Figure 1B:
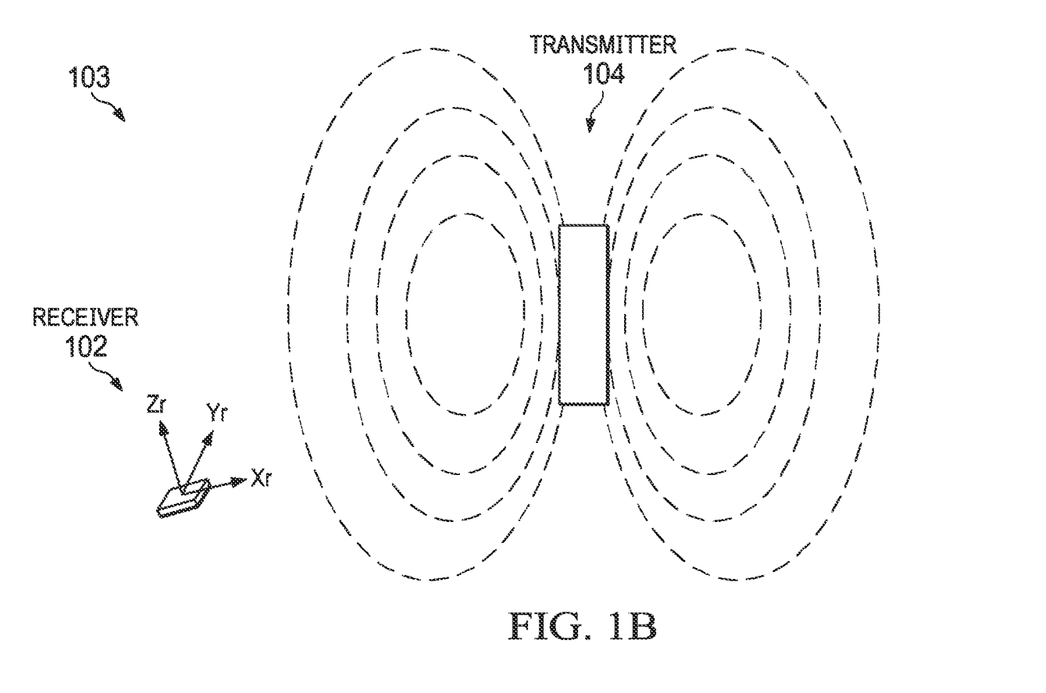
FIG. 1B illustrates a conventional magnetic tracking system that uses a magnet-based transmitter and a 3-axis magnetometer receiver.

Referring to FIG. 1B, an alternative magnetic tracking system 103 is shown that shows a magnet-based transmitter 104 that includes a magnet instead of a 3-axis coil to generate a static magnetic field for tracking purposes. This static magnetic field, however, is easily disturbed by environmental magnetic fields, such as Earth's magnetic field and other magnetic field sources external to magnetic tracking system 103.

Example Compact, Multi-User Magnetic Tracking System

Figure 2A:
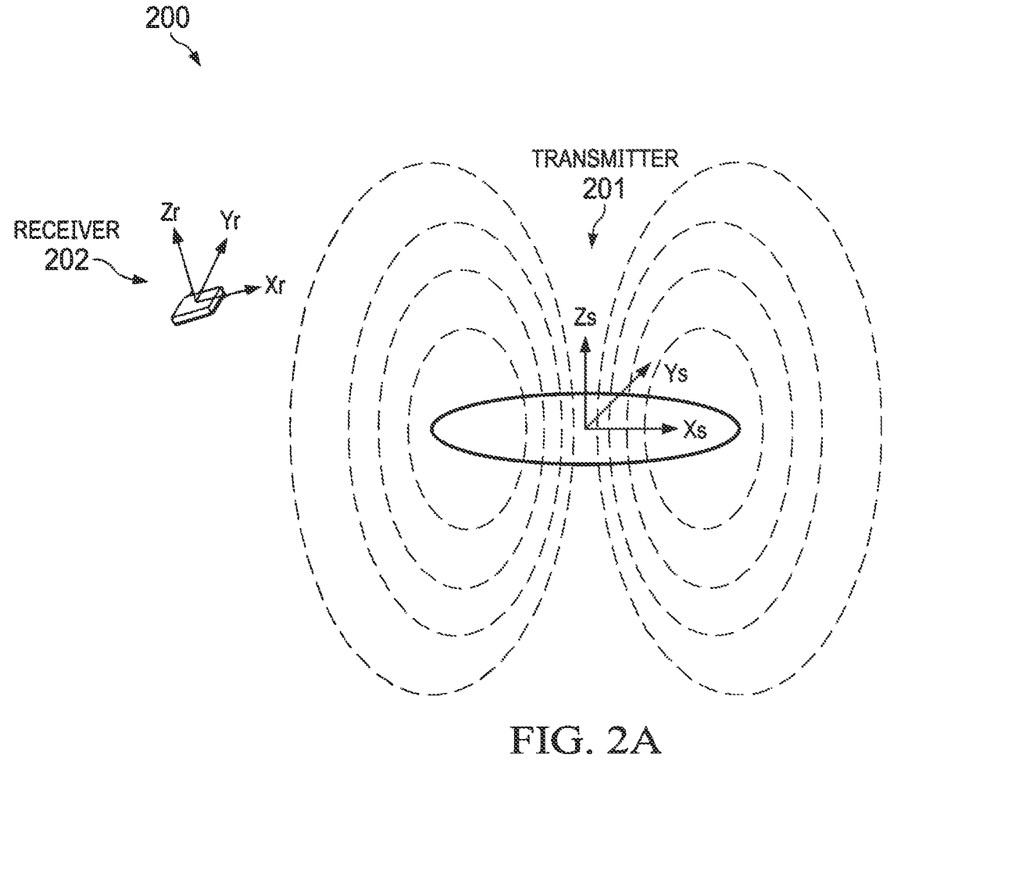
FIG. 2A illustrates a compact multi-user, multi-level, multi-target magnetic tracking system, according to an embodiment.

FIG. 2A illustrates compact, multi-user, multi-level, multi-target magnetic tracking system 200, according to an embodiment. System 200 includes transmitter 201 and receiver 202. Transmitter 201 includes a single-axis coil for emitting electromagnetic waves, a DC magnetometer, an inertial measurement unit (IMU) and a wireless transceiver (e.g., a Bluetooth transceiver chip) for clock synchronization ("clock sync") and data communication with receiver 202. Receiver 202 includes an AC magnetometer, DC magnetometer, an IMU and a wireless transceiver for clock synchronization and data communication with transmitter 201.

System 200 can be implemented in a multi-user, multi-level, and multi-target magnetic tracking system. Multi-level means there is a hierarchy of transmitters used for tracking. For example, in a home operating environment a transmitter could be in a smart speaker that tracks the movement of multiple users in a room, where each user has a receiver in their device tuned to the smart speaker transmitter. At a lower level in the hierarchy, there is also a transmitter on each device that tracks the motion of targets assigned to that particular device. In an embodiment, there could be another level down where a transmitter is worn on the wrist of each user (e.g., in a smart watch) and each transmitter tracks the motion of the user's fingers. Multi-users means each user carries a transmitter in there device. Multi-targets means each user's transmitter can track multiple targets (e.g., game controllers).

The AC magnetometer in receiver 202 is used to sense magnetic fields that are emitted by transmitter 201 that vary relatively rapidly in time (>100 Hz), and the DC magnetometers om transmitter 201 and receiver 202 measure magnetic fields that vary slowly (e.g., quasi-static) or are static. The IMUs can include one or more inertial sensors, such as one or more accelerometers and/or angular rate sensors (e.g., gyro sensors). In an embodiment, the IMU and magnetometers are included in a system-on-chip (SoC). In another embodiment, the IMU and magnetometers are fabricated on different silicon. The outputs of the IMUs and DC magnetometers of transmitter 201 and receiver 202 are used to determine the attitudes of transmitter 201 and receiver 202, respectively. The clock sync between the single-axis coil included in transmitter 201 and the AC magnetometer included in receiver 202 provides a phase for determining a quadrant (of a transmitter reference frame) in which receiver 202 is located. In an embodiment, clock sync is achieved by employing a PLL in receiver 202 that locks onto the signal received from transmitter 201, thus maintaining a constant phase relationship between the transmitter signal and receiver 202.

The removal of two coils in transmitter 201 in system 200 allows transmitter 201 to fit into a housing with a thin or flat form factor, such as a head-mounted display. The remaining single-axis coil simplifies the current driver electronics and reduces power consumption in transmitter 201. Due to removal of the two coils, compact, magnetic tracking system 200 does not require coil alignment or balancing with other coils and also needs less calibration.

Figure 2B:
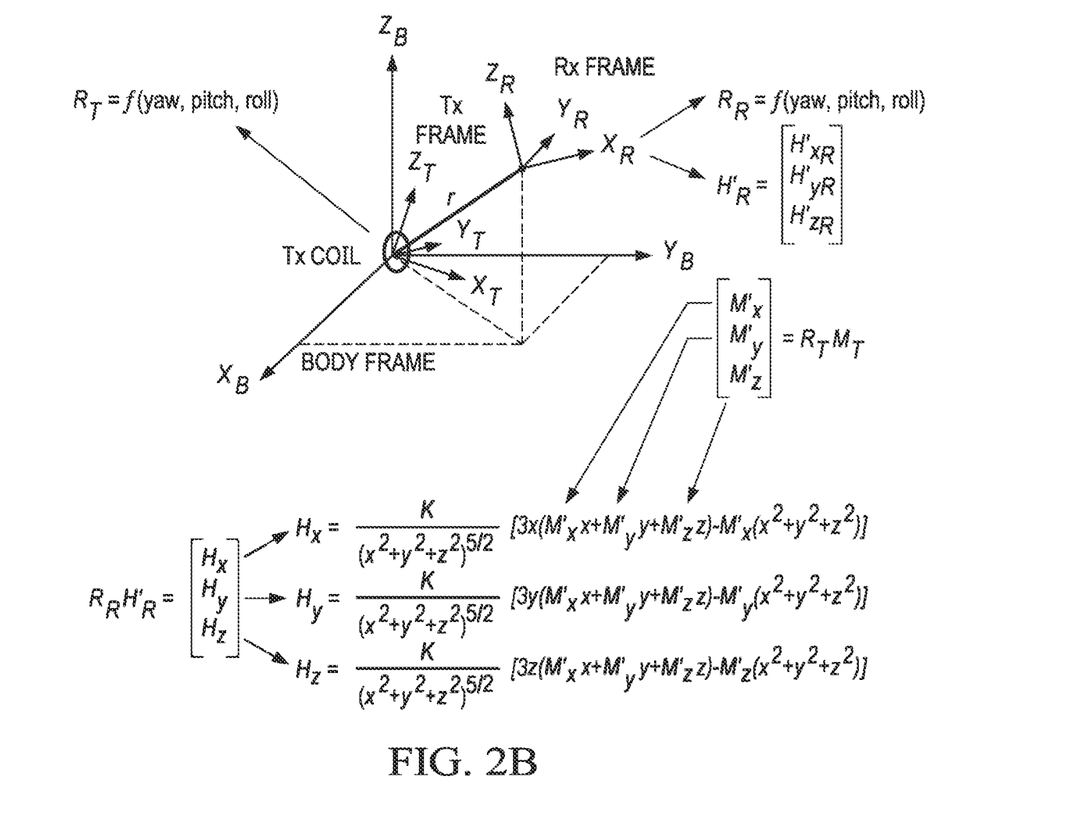
FIG. 2B illustrates a model for tracking a receiver using a transmitter with a single-axis coil, according to an embodiment.

Referring to FIG. 2B, a model for tracking a receiver using a transmitter with a single-axis coil is shown. In this model, the single-axis transmitter coil is located at the origin of a transmitter reference frame defined by unit vectors $X_T$, $Y_T$, $Z_T$. Also shown is a receiver body frame defined by unit vectors $X_R$, $Y_R$ and $Z_R$. $R_T$ represents a rotation transform (e.g., a direction cosine matrix or quaternion) of the transmitter reference frame with respect to a body reference frame $X_B$, $Y_B$, $Z_B$, and can be computed using yaw, pitch and roll angles derived from angular rate sensors (e.g., 3-axis MEMS gyros) in a transmitter IMU. $R_R$ represents a rotation transform (e.g., a direction cosine matrix or quaternion) of the receiver reference frame with respect to the body reference frame $X_B$, $Y_B$, $Z_B$ and can be computed using yaw, pitch and roll angles derived from angular rate sensors (e.g., 3-axis MEMS gyros) in a receiver IMU. In an embodiment, the transmitter (a single-axis coil) can be embedded in a head-mounted display, smart speaker, mobile device (e.g., smart phone, tablet computer), wearable computer (e.g., a smart watch) or headphones/earbuds.

In an embodiment, a dipole model (distance>>coil diameter) is used to derive a system of non-linear sense field Equations [1], where $H_x$, $H_y$, $H_z$ are the vector components of the dipole model in the receiver body frame, $M'_x$, $H'_y$, $M'_z$ are the dipole moments in a body reference frame and K is the dielectric constant of the medium and is known:

$$H_x = \frac{K}{(x^2+y^2+z^2)^{\frac{5}{2}}}[3x(M'_x x + M'_y y + M'_z z) - M'_x(x^2+y^2+z^2)], \quad [1]$$

$$H_x = \frac{K}{(x^2+y^2+z^2)^{\frac{5}{2}}}[3x(M'_x x + M'_y y + M'_z z) - M'_y(x^2+y^2+z^2)],$$

$$H_x = \frac{K}{(x^2+y^2+z^2)^{\frac{5}{2}}}[3x(M'_x x + M'_y y + M'_z z) - M'_z(x^2+y^2+z^2)],$$

In an embodiment, the steps to track the position of the receiver are as follows.

Step 1: Measure the magnetic field vector $H'_R$ at the receiver which is represented as:

$$H'_R = \begin{bmatrix} H'_{x_R} \\ H'_{y_R} \\ H'_{z_R} \end{bmatrix} \quad [2]$$

Step 2: De-rotate the measured magnetic field vector by multiplying the measured magnetic field vector by the receiver rotation transform $R_R$ ($R_R H'_R$) to give the magnetic field vector components of the dipole model ($H_x$, $H_y$, $H_z$) in the body reference frame shown in Equation [1] and FIG. 2B.

Step 3: De-rotate the dipole moment of the single-axis coil by multiplying the dipole moment $M_T$ by the transmitter rotation transform $R_T$ ($R_T M_T$) to give the dipole moment components of the dipole model ($M'_x$, $M'_y$, $M'_z$) in the body reference frame as shown in Equation [1] and FIG. 2B, where the dipole moment is computed as $M_T$=AI, where I is the current in the coil which can be measured and A is the area of the coil and is constant and known.

Step 4: With the magnetic field vector components ($H_x$, $H_y$, $H_z$) and the dipole moments ($M'_x$, $H'_y$, $M'_z$) of the dipole model determined, solve the system of non-linear Equations [1] for receiver position (x, y, z) using any suitable non-linear solver. In an embodiment, the initial receiver position (x, y, z) is determined using the Simplex method and the updated sensor position is determined using Newton's method or similar derivative-based methods, or any other suitable non-linear equation solver. In an embodiment, the receiver position (x, y, z) is computed in the receiver then transmitted wirelessly to the transmitter for tracking purposes. In an alternative embodiment, the send magnetic field vector components, magnetic moments and receiver rotation transform are transmitted wirelessly to the transmitter, where the position (x, y, z) is determined and tracked by a processor of the transmitter.

The dipole model described above provides good position accuracy and is dependent on: 1) undistorted magnetic field, 2) small errors in Tx and Rx attitudes, 3) constant and known K and 4) a correct magnetic field model. Additionally, good position precision depends on the amount of magnetic field noise and Tx, Rx attitude noise.

Figure 3A:
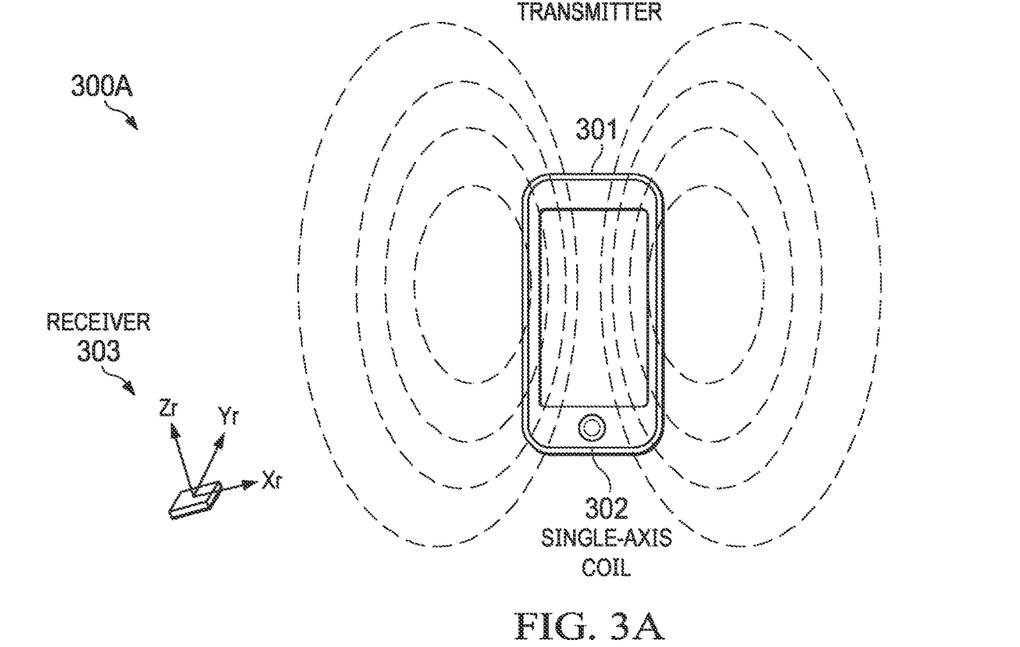
FIG. 3A illustrates an implementation of the compact multi-user, multi-level, multi-target magnetic tracking system of FIGS. 2A and 2B, according to an embodiment.

FIG. 3A illustrates an implementation of magnetic tracking system 300A, according to an embodiment. Single-axis coil 302 is embedded inside host device 301 and generates an AC magnetic field. Host device 301 also has an integrated IMU and DC magnetometer (both not shown) to determine the attitude/heading of host device 301. In an embodiment, receiver 303 includes any type of pickup coils or MR sensor, including but not limited to: Anisotropic Magneto resistive (AMR), Giant Magnetoresistance (GMR) sensor or Tunnel Magnetoresistance (TMR) sensor. The pickup coil or MR sensor is used to detect the AC magnetic field generated by single-axis coil 302 of host device 301. Receiver 303 also has an IMU and DC magnetometer to determine the attitude/heading of receiver 303. Both host device 301 and receiver 303 include a wireless transceiver (not shown) for exchanging clock synchronization data.

In an embodiment, the position (x, y, z) of receiver 303 is computed 301 by a computer processor of receiver 303 by solving the system of non-linear Equations [1]. The relative attitude between host device 301 and receiver 303 is determined by measurements/readings of the IMUs and magnetometers of host device 301 and receiver 303. In an embodiment, the attitude or heading (e.g., the receiver rotation transform $R_R$) and/or raw inertial sensor and DC magnetometer readings obtained by receiver 303 are transmitted to host device 301 using the wireless transceivers of the host device 301 and receiver 303, so that the relative attitude between host device 301 and receiver 303 can be computed by a processor of host device 301. In an embodiment, Bluetooth protocol is used to establish a short-range, bi-directional communication link between respective wireless transceivers of host device 301 and receiver 303 after a successful pairing process is performed.

Figure 3B:
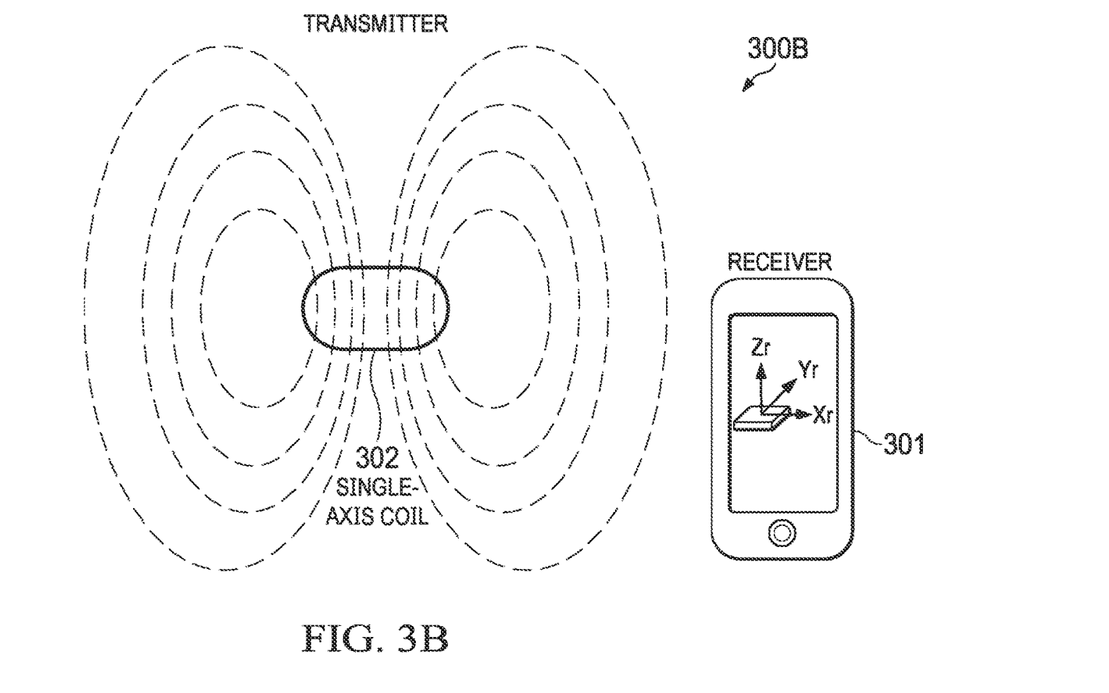
FIG. 3B illustrates an alternative implementation of the compact magnetic tracking system of FIGS. 2A and 2B, according to an embodiment.

FIG. 3B illustrates an alternative implementation of the magnetic tracking system 200, according to an embodiment. In this example embodiment, the roles of host device 301 and receiver 303 are reversed and host device 301 operates as a "receiver" and receiver 303 operates as a "transmitter," as described above. Host device 301 includes any type of pickup coils and/or MR sensor (e.g., AMR, GMR, TMR sensors), IMU and DC magnetometer. Receiver 303 includes single-axis coil 302, IMU and DC magnetometer.

Example FDM/TD for Multi-User Magnetic Tracking System

Figure 4:
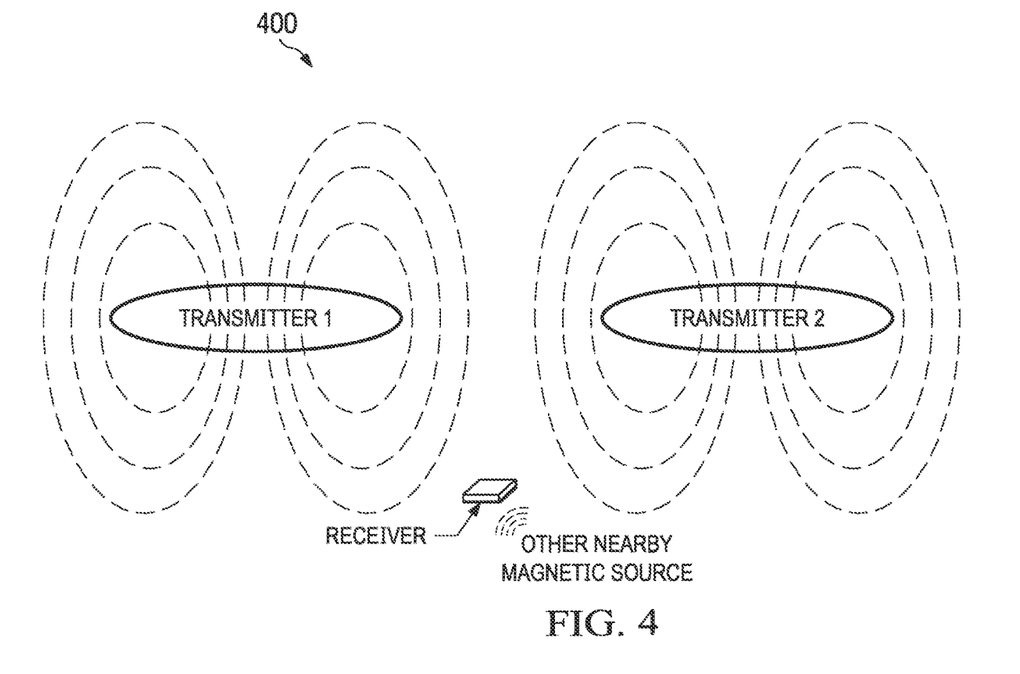
FIG. 4 illustrates magnetic interference from multiple transmitters and/or nearby magnetic sources, according to an embodiment.

FIG. 4 illustrates environment 400 where magnetic interference is coming from multiple transmitters and/or nearby magnetic sources. When there are multiple tracking systems close to each other, the magnetic fields generated by multiple transmitters may overlap with each other, resulting in false tracking as shown in FIG. 4. Interference can also be generated from nearby magnetic field sources.

Figure 5:
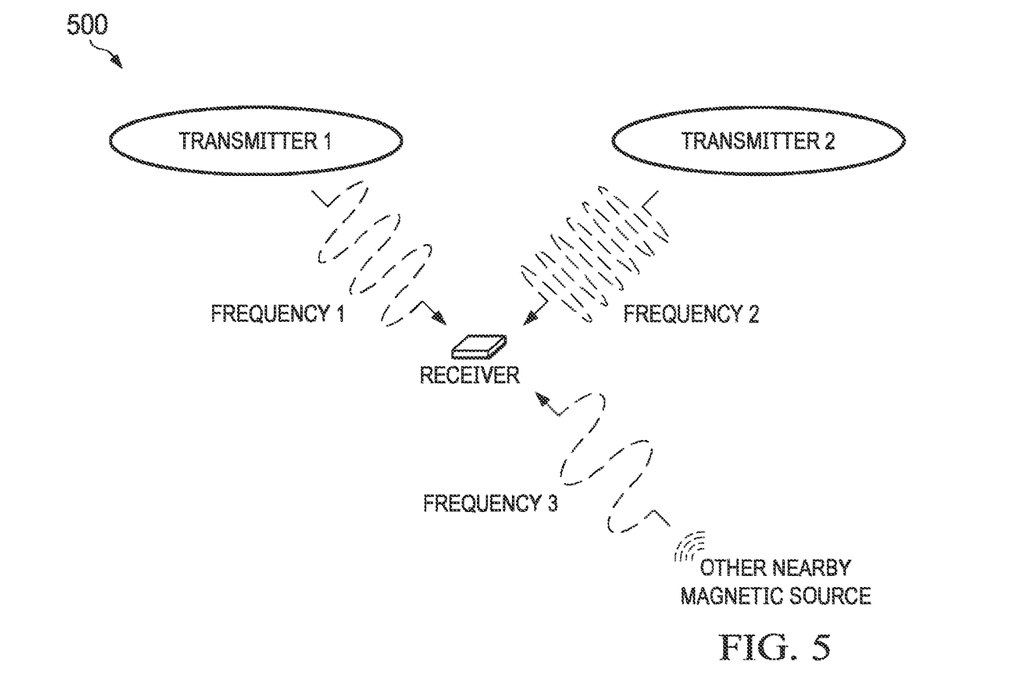
FIG. 5 illustrates the principle of frequency division multiplexing (FDM) in a multi-user magnetic tracking system, according to an embodiment.

In an embodiment, frequency division multiplexing (FDM) is used to address the multi-user problem described above. When the transmitter (or receiver) device detect an interference magnetic field, the transmitter changes or "hops" to another operating frequency and informs the receiver (or transmitter) device over a wireless communication link to change its demodulation frequency to the new operating frequency. When there are multiple transmitters, the transmitters communicate with each other through a wireless ad hoc network (e.g., a Bluetooth piconet), where one transmitter is a master node that assigns different working frequencies to the other transmitter devices in the network. Using the wireless ad hoc network, the multi-user magnetic tracking system is able to detect and/or differentiate between multiple users that are close to each other, and use FDM to reduce or remove interference, as shown in FIG. 5.

Figure 6:
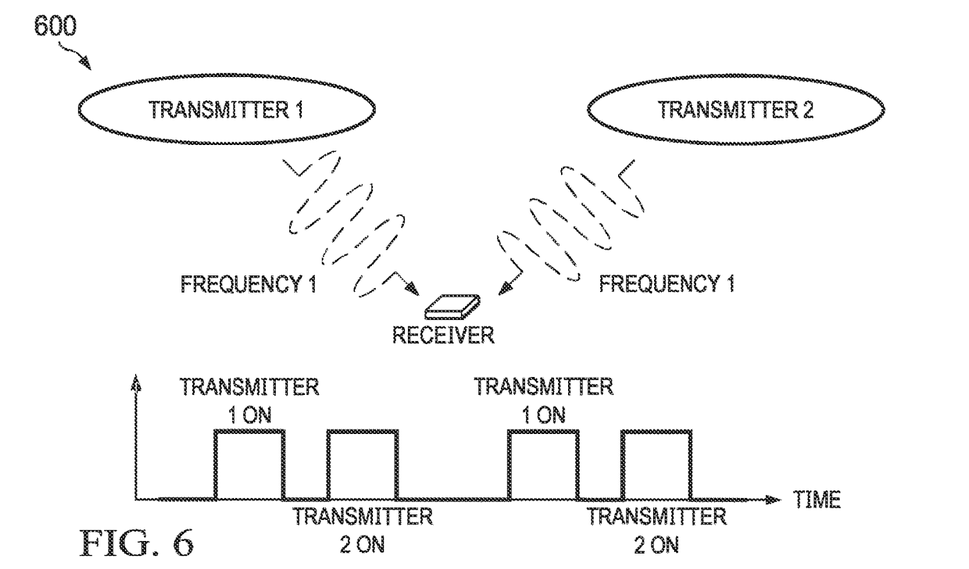
FIG. 6 illustrates the principle of time division multiplexing (TDM) in a multi-user magnetic tracking system, according to an embodiment.

In another embodiment, time division multiplexing (TDM) is used to address the multi-user problem. When there are multiple transmitters transmitting, the transmitters communicate with each other using the wireless ad hoc network to assign a time slot for each transmitter to transmit, as shown in FIG. 6. Using TDM only one transmit will emit a magnetic field at a time.

Figure 7:
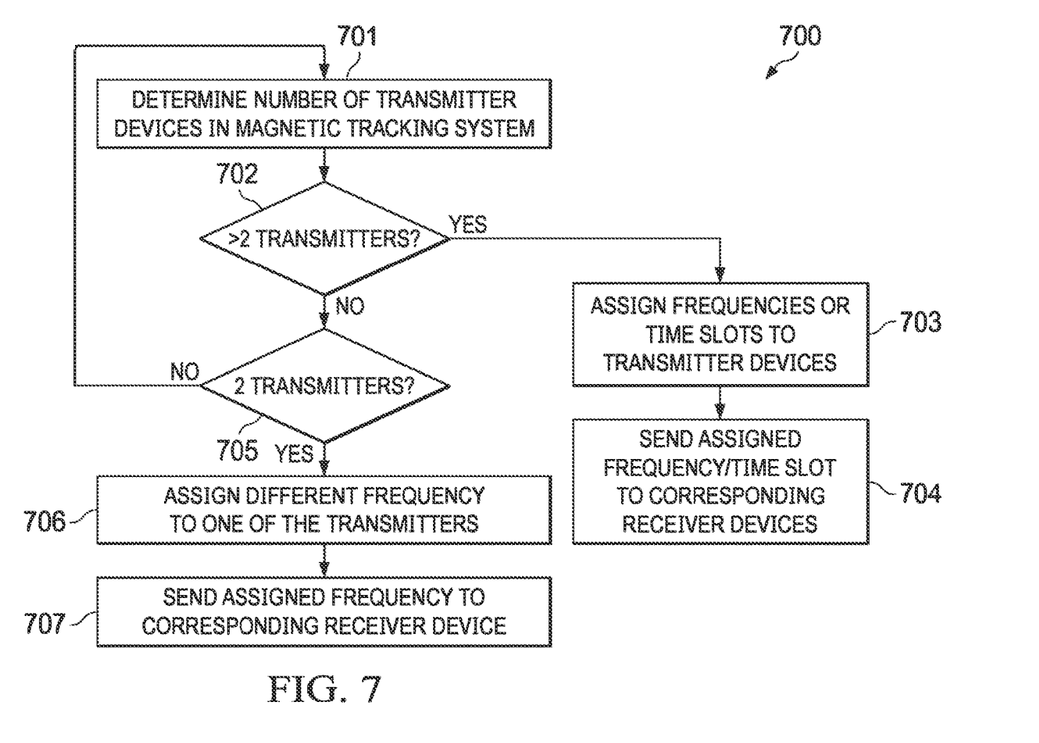
FIG. 7 is a flow diagram of process of using FDM/TDM in a multi-user magnetic tracking system, according to an embodiment.

FIG. 7 is a flow diagram of process 700 of using FDM/TDM in a multi-user magnetic tracking system, according to an embodiment. Process 700 can be implemented using, for example, device architecture 800 shown in FIG. 8.

Process 700 begins by determining a number of transmitters in the multi-user magnetic tracking system (701). For example, a master node in a Bluetooth piconet can determine the number of transmitter devices in the piconet based on a wireless scan of the environment.

Process 700 continues by determining if there are more than two transmitters in the multi-user magnetic tracking system (702). In accordance with there being more than two transmitters in the multi-user magnetic tracking system, frequencies or time slots are assigned to the transmitters (703), and the assigned frequencies or time slots are sent to the corresponding receivers in the multi-user magnetic tracking system (804), so that the demodulation frequency can be changed by the receivers to the assigned frequency for FDM, or the correct time slots can be demultiplexed for TDM.

Process 700 continues by determining if there are two transmitters operating in proximity to each other (705), and if so, assigning a different operating frequency to one of the two transmitters (706), and sending the assigned frequency to the corresponding receiver to change the demodulation frequency, so that data is properly demodulated by the receiver (707).

In an embodiment, the transmitters communicate using a wireless ad hoc network, such as a mobile ad hoc network (MANET), where one transmitter device can operate as a master node for the multi-user magnetic tracking system and create an assignment table in its local memory for the assigned operating frequencies and/or time slots. An example MANET is a Bluetooth piconet. In an embodiment, each row in the assignment table can include a column for a unique identifier for the transmitter device (e.g., mobile ID) and/or media access control (MAC) address and a column for the operating frequency or time slot. If one or more transmitter devices enters or leaves the magnetic tracking system, the master transmitting device updates the assignment table accordingly. TDM can be performed using a round robin technique. The assignment table can be replicated on all transmitter devices operating in the wireless ad hoc network. The wireless ad hoc network also allows any one of the transmitter devices to become the master should the current master leave the multi-user magnetic tracking system.

Example Device Architecture

Figure 8:
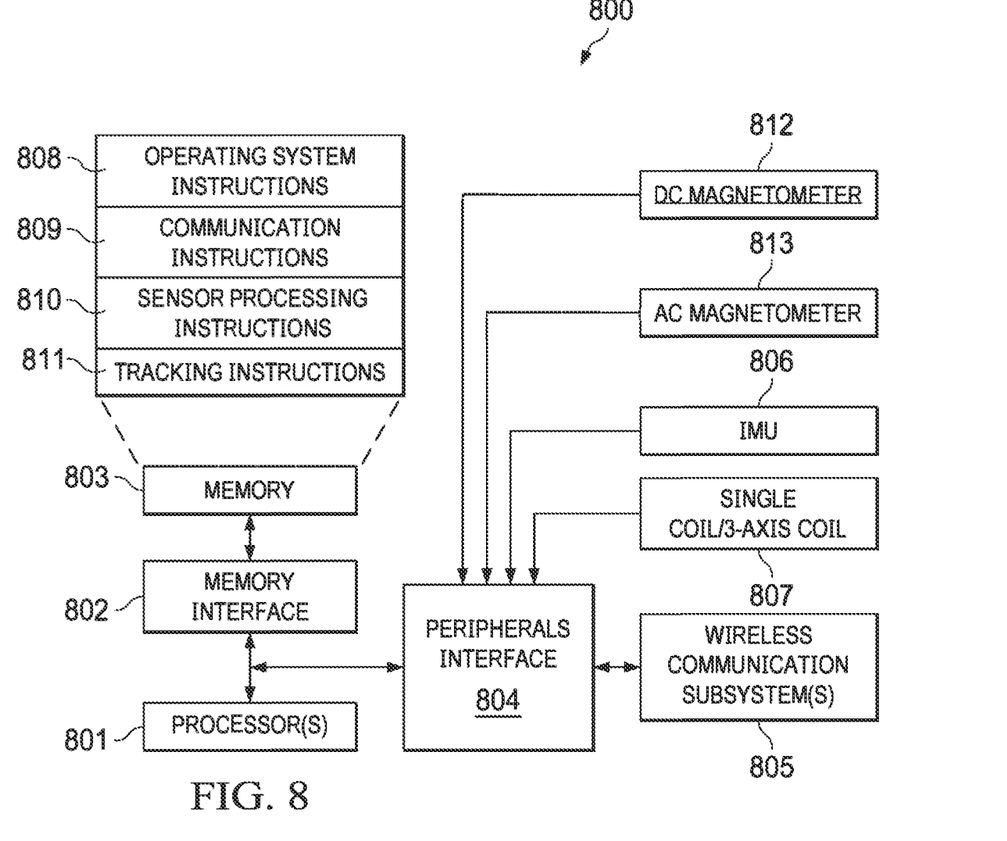
FIG. 8 illustrates a device architecture for the transmitter or receiver for the multi-user magnetic tracking system, described in reference to FIGS. 1-7, according to an embodiment.

FIG. 8 illustrates a device architecture for implementing the transmitter or receiver described in reference to FIGS. 1-8, according to an embodiment. Architecture 800 can be implemented in any desired system or product, including but not limited to a smart phone, smartwatch, smart glasses or smart pencil. Architecture 800 can include memory interface 802, one or more data processors, video processors, co-processors, image processors and/or other processors 801, and peripherals interface 804. Memory interface 802, one or more processors 801 and/or peripherals interface 804 can be separate components or can be integrated in one or more integrated circuits. The various components in architecture 800 can be coupled by one or more communication buses or signal lines.

Sensors, devices and subsystems can be coupled to peripherals interface 804 to facilitate multiple functionalities. In this example architecture 800, IMU 806, DC magnetometer 812, AC magnetometer 813 and single/3-axis coil 807 are connected to peripherals interface 804 to provide data that can be used to determine a change in magnetic field gradient as a function of time and distance, as previously described in reference to FIGS. 1-7. IMU 806 can include one or more accelerometers and/or angular rate sensors (e.g. gyro sensors) configured to determine the change of speed and direction of movement of the device. Peripheral interface 804 also includes a current driver coupled to single/3-axis coil 807 for driving current into single/3-axis coil 807.

Communication functions can be facilitated through one or more wireless communication subsystems 805, which can include radio frequency (RF) receivers and transmitters (or transceivers) and/or optical (e.g., infrared) receivers and transmitters. The specific design and implementation of the communication subsystem 805 can depend on the communication network(s) over which a mobile device is intended to operate. For example, architecture 800 can include communication subsystems 805 designed to operate over a GSM network, a GPRS network, an EDGE network, a Wi-Fi™ or Wi-Max™ network or a Bluetooth™ network.

Memory interface 802 can be coupled to memory 803. Memory 803 can include high-speed random access memory and/or non-volatile memory, such as one or more magnetic disk storage devices, one or more optical storage devices and/or flash memory (e.g., NAND, NOR). Memory 803 can store operating system 808, such as iOS, Darwin, RTXC, LINUX, UNIX, OS X, WINDOWS, or an embedded operating system such as VxWorks. Operating system 808 may include instructions for handling basic system services and for performing hardware dependent tasks. In some implementations, operating system 808 can include a kernel (e.g., UNIX kernel).

Memory 803 stores communication instructions 809 to facilitate communicating with one or more additional devices via a wireless ad hoc network (e.g., a Bluetooth piconet) or other communication medium, one or more computers and/or one or more servers, such as, for example, instructions for implementing a software stack for wired or wireless communications with other devices. Memory 803 stores sensor processing instructions 810 to facilitate sensor-related processing and functions, such as processing output from single coil/3-axis coil 807. Memory 803 stores tracking instructions 811 to provide the features and perform the processes described in reference to FIGS. 1-7, including solving the non-linear system of Equations [1]. Memory also stores instructions for one or more applications that use the position tracking described in reference to FIGS. 1-7, such as augmented reality (AR) or virtual reality (VR) applications.

Each of the above identified instructions and applications can correspond to a set of instructions for performing one or more functions described above. These instructions need not be implemented as separate software programs, procedures, or modules. Memory 803 can include additional instructions or fewer instructions. Furthermore, various functions of the mobile device may be implemented in hardware and/or in software, including in one or more signal processing and/or application specific integrated circuits.

The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language (e.g., SWIFT, Objective-C, C#, Java), including compiled or interpreted languages, and it can be deployed in any form, including as a stand-alone program or as a module, component, subroutine, a browser-based web application, or other unit suitable for use in a computing environment.

Suitable processors for the execution of a program of instructions include, by way of example, both general and special purpose microprocessors, and the sole processor or one of multiple processors or cores, of any kind of computer. Generally, a processor will receive instructions and data from a read-only memory or a random-access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor or a retina display device for displaying information to the user. The computer can have a touch surface input device (e.g., a touch screen) or a keyboard and a pointing device such as a mouse or a trackball by which the user can provide input to the computer. The computer can have a voice input device for receiving voice commands from the user.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

What is claimed is:

1. A transmitter of a magnetic tracking system, the transmitter comprising:
    a single-axis coil;
    a current driver coupled to the single-axis coil and configured to provide current to the single-axis coil to cause the single-axis coil to emit an alternating current (AC) magnetic field;
    one or more inertial sensors;
    a direct current (DC) magnetometer;
    a wireless transceiver;
    one or more processors;
    memory coupled to the one or more processors and storing instructions that when executed by the one or more processors, cause the one or more processors to perform operations, comprising:
        causing the current driver to provide current to the single-axis coil to emit a magnetic field;
        determining, using output from the one or more inertial sensors and DC magnetometer, an attitude of the transmitter; and
        causing the wireless transceiver to transmit the attitude and clock sync signal to a receiver.

2. The transmitter of claim 1, wherein the transmitter is configured to track two or more receivers.

3. The transmitter of claim 1, further comprising:
    causing the wireless transceiver to transmit the attitude and clock sync signal to the receiver using time-division multiplexing, wherein the transmitter is assigned a time slot for transmitting to the receiver.

4. The transmitter of claim 1, further comprising:
    causing the wireless transceiver to transmit the attitude and clock sync signal to the receiver using frequency-division multiplexing, wherein the transmitter is assigned a communication frequency for transmitting to the receiver.

5. The transmitter of claim 1, wherein the transmitter is a smart speaker, mobile device or wearable computer.

6. A receiver of a magnetic tracking system, the receiver comprising:
    one or more inertial sensors;
    a direct current (DC) magnetometer;
    an alternate current (AC) magnetometer configured to sense an AC magnetic field emitted by a transmitter;
    a wireless transceiver;
    one or more processors;
    memory coupled to the one or more processors and storing instructions that when executed by the one or more processors, cause the one or more processors to perform operations comprising:
        determining, using output from the one or more inertial sensors and DC magnetometer, an attitude of the receiver;
        obtaining, using the wireless transceiver, an attitude of the transmitter and a clock sync signal; and
        computing a position and relative attitude of the transmitter with respect to the receiver using the sensed magnetic field, the receiver attitude, the transmitter attitude and the clock sync signal.

7. The receiver of claim 6, wherein the AC magnetometer provides a phase for determining a quadrant in which the transmitter is located.

8. The receiver of claim 6, wherein clock sync is achieved using a phase-locked loop (PLL) that locks onto the clock sync signal received from the transmitter.

9. The receiver of claim 6, further comprising a pickup coil or magnetoresistive (MR) sensor configured to detect the AC magnetic field generated by the single-axis coil of the transmitter.

10. A method performed by a receiver of a magnetic tracking system, comprising:
    obtaining, using one or more processors of the receiver, first sensor data from one or more inertial sensors of the receiver;
    obtaining, using the one or more processors, second sensor data from a direct current (DC) magnetometer of the receiver;
    determining, using the one or more processors, an attitude of the receiver based on the first and second sensor data;
    computing, using the one or more processors, a receiver rotation transform based on the attitude of the receiver;

obtaining, using a wireless transceiver, an attitude of a transmitter and a clock sync signal for syncing communication between the receiver and the transmitter;

computing, using the one or more processors, a transmitter rotation transform based on the attitude of the transmitter;

computing, using the one or more processors, a position of the receiver by:

measuring a magnetic field emitted by the transmitter;

multiplying the measured magnetic field vector by the receiver rotation transform to obtain magnetic field vector components of a dipole model in a reference coordinate frame;

multiplying a dipole moment by the transmitter rotation transform to obtain dipole moment components of the dipole model in the reference coordinate frame; and determining, using the dipole model, the receiver position.

11. The method of claim 10, using an AC magnetometer of the receiver to determine a quadrant in the reference coordinate system where the transmitter is located.

12. The method of claim 10, further comprising:

transmitting, using a wireless transceiver of the receiver, the receiver position to the transmitter.

\* \* \* \* \*

UNITED STATES PATENT AND TRADEMARK OFFICE
CERTIFICATE OF CORRECTION

| | | |
|---|---|---|
| PATENT NO. | : 11,965,944 B2 | Page 1 of 1 |
| APPLICATION NO. | : 17/410980 | |
| DATED | : April 23, 2024 | |
| INVENTOR(S) | : Guangwu Duan et al. | |

It is certified that error appears in the above-identified patent and that said Letters Patent is hereby corrected as shown below:

In the Claims

Column 10, Line 53, in Claim 9, delete "by the" and insert -- by a --.

Signed and Sealed this
Sixth Day of August, 2024

*Katherine Kelly Vidal*

Katherine Kelly Vidal
*Director of the United States Patent and Trademark Office*